United States Patent
Do

(10) Patent No.: US 12,155,004 B2
(45) Date of Patent: Nov. 26, 2024

(54) METHOD OF SEPARATING PLURALITY OF LED STRUCTURES FROM WAFER

(71) Applicant: KOOKMIN UNIVERSITY INDUSTRY ACADEMY COOPERATION FOUNDATION, Seoul (KR)

(72) Inventor: Young Rag Do, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 421 days.

(21) Appl. No.: 17/563,393

(22) Filed: Dec. 28, 2021

(65) Prior Publication Data

US 2022/0209043 A1 Jun. 30, 2022

(30) Foreign Application Priority Data

Dec. 31, 2020 (KR) .................. 10-2020-0189204

(51) Int. Cl.
*H01L 33/00* (2010.01)
(52) U.S. Cl.
CPC .................. *H01L 33/0093* (2020.05)
(58) Field of Classification Search
None
See application file for complete search history.

(56) References Cited

U.S. PATENT DOCUMENTS

| | | | | |
|---|---|---|---|---|
| 2020/0366064 A1* | 11/2020 | McLaurin | ........... | H01S 5/02345 |
| 2021/0167124 A1* | 6/2021 | Min | ............ | H01L 33/0062 |
| 2024/0030275 A1* | 1/2024 | Avramescu | ............ | H01L 33/16 |
| 2024/0120435 A1* | 4/2024 | Raring | ............... | H01L 25/0753 |

FOREIGN PATENT DOCUMENTS

| | | |
|---|---|---|
| KR | 100974288 | 8/2010 |
| KR | 20130007557 | 1/2013 |
| KR | 1020130007557 | 1/2013 |
| KR | 20200015871 | 2/2020 |
| KR | 1020200015871 | 2/2020 |

OTHER PUBLICATIONS

Office Action issued in corresponding Korean Application No. 10-2020-0189204, dated Mar. 16, 2022 (Korean Only).

* cited by examiner

*Primary Examiner* — Bradley Smith
(74) *Attorney, Agent, or Firm* — NORTON ROSE FULBRIGHT US LLP

(57) ABSTRACT

The present disclosure relates to a method of separating a plurality of light-emitting diode (LED) structures from a wafer. According to the method, the LED structures each having a desired size, thickness, and shape can be separated from the wafer, using a commercialized wafer, without damage to the LED structures even without considering the presence or absence of a sacrificial layer and specifically pre-designing a thickness of semiconductor layers in the wafer from the time of wafer manufacturing.

15 Claims, 12 Drawing Sheets

METHOD OF SEPARATING PLURALITY OF LED STRUCTURES FROM WAFER

CROSS-REFERENCE TO RELATED APPLICATION

This application claims priority to and the benefit of Korean Patent Application No. 10-2020-0189204, filed on Dec. 31, 2020, the disclosure of which is incorporated herein by reference in its entirety.

BACKGROUND

1. Field of the Invention

The present disclosure relates to a method of separating a plurality of light-emitting diodes (LED) structures from a wafer.

2. Discussion of Related Art

Micro-light-emitting diodes (Micro-LEDs) and nano-LEDs may implement an excellent feeling of color and high efficiency and may be eco-friendly materials, thereby being used as core materials for displays. In line with such market conditions, recently, research for developing LEDs through new nano-LED structures or new manufacturing processes is being conducted.

Conventionally, it has been known that independent individual LED elements may be manufactured by a bottom-up method and a top-down method, but in some areas, it is more preferred to manufacture the LED elements by the bottom-up method based on a chemical growth method.

However, it is not easy to manufacture hundreds of millions of independent LED elements each having a nano-level ultra-small size by the bottom-up method, and even when the independent LED elements are manufactured, it is difficult to manufacture the LED elements so that each element has a uniform size and uniform characteristics.

On the other hand, the top-down method has an advantage that thousands to hundreds of millions of independent LED elements with uniform characteristics may be manufactured when wafers are etched to a desired size and number from a large-area wafer and the LED structures remaining after etching are separated from the wafer.

In the case of the conventional top-down method, a method of lifting off a substrate is used as a method of separating remaining LED structures after etching in a vertical direction. With this method, since the wafer should be vertically etched until it reaches the substrate, a height of the LED structure is inevitably equal to a total height of remaining semiconductor layers except for the substrate from the wafer, and thus, there is a problem that a height of the LED element may not be adjusted as desired, and the height of each LED element is already determined in the manufactured wafer.

In order to solve this problem, a method of separating the LED structures from the semiconductor layer by applying ultrasonic waves to the vertically etched LED structure has been introduced. However, this method has limitations in that an aspect ratio and a diameter of a bottom surface are limited, and specifically, the diameter of the bottom surface should be smaller than 500 nm and a height should be 5 times or more the diameter of the bottom surface to be used, and thus there is a problem in that the LED structure may not be separated using the corresponding method when the desired size or aspect ratio of the LED element does not satisfy the above-mentioned values. In addition, with this method, the applied ultrasonic waves also affect other parts of the LED structure in addition to a desired interface between a lower end of the LED structure and the semiconductor layer connected to the lower end, and there were frequent cases in which the middle of the LED structure that is out of the desired position is cut off and separated from the wafer. Thus, it is difficult to make the shape and size quality of the LED structure separated from the wafer uniform.

Further, as another method, a method of separating the LED structures by applying a sacrificial layer on the LED wafer and removing the sacrificial layer has been introduced. However, with this method, there are problems that the type of wafer that may be used may be limited because the sacrificial layer should be provided on the wafer itself, costs may increase because the sacrificial layer is added, and an etching solution used for removing the sacrificial layer may cause chemical damage to the LED structure.

Accordingly, there is an urgent need to develop a method capable of easily separating the LED structures from the wafer without damage to the LED structures while not being limited by the type of wafer used and the size and shape of LED structure to be implemented.

SUMMARY OF THE INVENTION

The present disclosure is directed to providing a method capable of easily separating light-emitting diode (LED) structures each having a desired size and shape from a wafer, using a commercialized wafer, without damage to the LED structures even without considering the presence or absence of a sacrificial layer and specifically pre-designing a thickness of semiconductor layers in the wafer from the time of wafer manufacturing.

The present disclosure is also directed to providing a method of separating LED structures from a wafer allowing a cutting defect, in which separation occurs at a point other than a desired point when separating the LED structures from the wafer, to be prevented.

According to an aspect of the present disclosure, there is provided a method of separating a plurality of LED structures from an LED wafer on which the plurality of LED structures are formed, wherein the plurality of LED structures include a second portion of a doped n-type III-nitride semiconductor layer and the second portion is formed on and connected to a first portion of the doped n-type III-nitride semiconductor layer, the method including operation (1) of forming a protective film so as to surround an exposed surface of each of the plurality of LED structures but expose an upper surface of the first portion between adjacent LED structures to the outside, operation (2) of immersing the LED wafer in an electrolyte, electrically connecting one terminal of a power supply to the LED wafer and the other terminal of the power supply to an electrode immersed in the electrolyte, and applying power to form a plurality of pores in the first portion, and operation (3) of applying ultrasonic waves to the LED wafer to separate the plurality of LED structures from the first portion in which the plurality of pores are formed.

Each of the plurality of LED structures may further include a photoactive layer and a p-type III-nitride semiconductor layer stacked on the second portion of the doped n-type III-nitride semiconductor layer.

The LED wafer on which the plurality of LED structures are formed may be formed by operations including operation (a) of preparing the LED wafer in which layers including the doped n-type III-nitride semiconductor layer, a photoactive layer, and a p-type III-nitride semiconductor layer are stacked on a substrate, and operation (b) of forming the plurality of LED structures by patterning an upper portion of the LED wafer such that the planar surface perpendicular to a direction, in which the layers in the individual LED structure are stacked, has a desired shape and size, and vertically etching the doped n-type III-nitride semiconductor layer to at least a partial thickness.

The protective film may have a function of preventing damage to the LED structure due to the performing of operation (2).

The protective film formed in operation (1) may be a temporary protective film for preventing damage to the LED structure due to the performing of operation (2), and the method may further include forming a surface protective film that surrounds side surfaces of the LED structure, after removing the temporary protective film between operation (2) and operation (3).

An area of a bottom surface of the LED structure, which is connected to the first portion, may be 25 µm² or less.

A thickness of the protective film may be in a range of 5 nm to 100 nm.

The protective film may include at least one selected from the group consisting of silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), lanthanum oxide ($La_2O_3$), scandium oxide ($Sc_2O_3$), titanium dioxide ($TiO_2$), aluminum nitride (AlN), and gallium nitride (GaN).

Operation (2) may be performed by applying a voltage of 3 V or more for 1 minute to 24 hours.

In operation (2), an average diameter of the plurality of pores is 100 nm or less.

The electrolyte may include at least one oxyacid selected from the group consisting of oxalic acid, phosphoric acid, sulfurous acid, sulfuric acid, carbonic acid, acetic acid, chlorous acid, chloric acid, bromic acid, nitrous acid, and nitric acid.

In operation (3), the plurality of LED structures may be separated from the LED wafer by immersing the LED wafer in a bubble-forming solution, and then applying ultrasonic waves to the bubble-forming solution to generate bubbles and collapse the pores through energy generated when the generated bubbles burst in the pores.

A frequency of the ultrasonic wave applied to the bubble-forming solution may be in a range of 10 kHz to 2 MHz to grow and collapse the bubbles so as to become local hot spots that generate a high pressure and temperature when the bubbles are collapsed.

In addition, a solution that is less harmful to the environment while having a low vapor pressure may be used as the bubble-forming solution.

Operation (1) may include forming the protective film on the LED wafer so that the protective film is formed to surround side surfaces of each of the plurality of LED structures, and removing the protective film formed on the upper surface of the first portion between the adjacent LED structures so that the upper surface of the first portion between the adjacent LED structures is exposed.

The method further includes, between operation (2) and operation (3), removing the protective film formed on an upper portion of each of the LED structures, and forming a first electrode on the upper portion of the LED structure.

According to another aspect of the present disclosure, there is provided an LED structure aggregate manufactured according to the present disclosure, wherein each of a plurality of LED structures is separated.

Hereinafter, the terms used in the present invention will be defined.

In descriptions of embodiments of the present invention, it should be understood that when, a layer, region, or pattern is referred to as being "on," "above," "under," or "below" a substrate, another layer, another region, or another pattern, the terminology of "on," "above," "under," or "below" includes both the meanings of "directly" and "indirectly" "on," "above," "under," or "below."

The present invention has been researched under support of National Research and Development Project, and specific information of National Research and Development Project is as follow:

[Project Series Number] 1711105790
[Project Number] 2016R1A5A1012966
[Government Department Name] Ministry of Science and ICT
[Project Management Authority Name] National Research Foundation of Korea
[Research Program Name] Science and Engineering Research Center (S/ERC)
[Research Project Name] Circadian ICT research center using hybrid device
[Project Execution Organization Name] Kookmin University Industry Academic Cooperation Foundation
[Period of Research] Jan. 1, to Dec. 31, 2021
[Project Series Number] 1415174040
[Project Number] 20016290
[Government Department Name] Ministry of Trade, Industry and Energy
[Project Management Authority Name] Korea Evaluation Institute of Industrial Technology
[Research Program Name] Electronic Components Industry Technology Development-Super Large Micro-LED Modular Display
[Research Project Name] Development of sub-micron blue light-emitting source technology for modular display
[Project Execution Organization Name] Kookmin University Industry Academic Cooperation Foundation
[Period of Research] Apr. 1, 2021 to Dec. 31, 2024

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Embodiments of the present disclosure will be described in detail below so that those skilled in the art may easily implement the disclosure. The present disclosure may be implemented in several different forms, and are not limited to the embodiments described herein.

A method of separating a plurality of light-emitting diode (LED) structures from a wafer according to one embodiment of the present disclosure is a method of separating a plurality of LED structures from an LED wafer on which the plurality of LED structures are formed, wherein the plurality of LED structures include a second portion of a doped n-type III-nitride semiconductor layer and the second portion is formed on and connected to a first portion of the doped n-type III-nitride semiconductor layer. The method includes operation (1) of forming a protective film so as to surround an exposed surface of each of the plurality of LED structures but expose an upper surface of the first portion between adjacent LED structures to the outside, operation (2) of impregnating the LED wafer in an electrolyte, and electrically connecting one terminal of a power supply to the LED wafer and the other terminal of the power supply to an electrode impregnated in the electrolyte, and then applying power to form a plurality of pores in the first portion, and operation (3) of applying ultrasonic waves to the LED wafer to separate the plurality of LED structures from the first portion in which the plurality of pores are formed.

Figure 1:
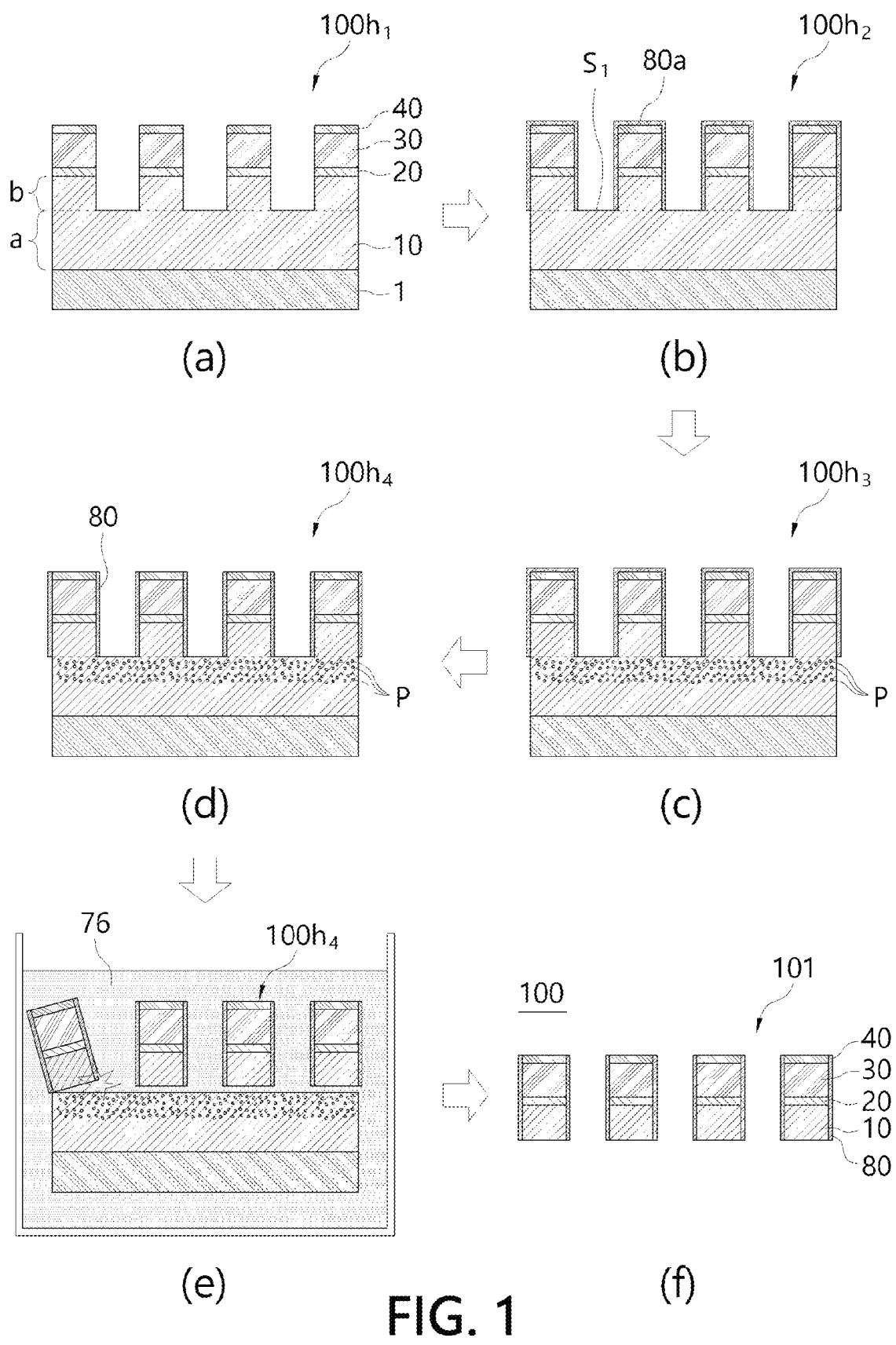
FIG. 1 is a set of schematic views of a process of separating a plurality of nanostructures from a wafer according to one embodiment of the present disclosure.

When describing with reference to FIG. 1, an LED wafer 100$h_i$ on which operation (1) according to the present disclosure is performed may be an LED wafer in a state before separating the plurality of LED structures into individual independent elements after vertically etching a typical LED wafer wherein a plurality of LED structures including a second portion b of a doped n-type III-nitride semiconductor layer 10 at lower end portions thereof are formed on a first portion a of the doped n-type III-nitride semiconductor layer 10, and the first portion a is connected to the second portion b. In addition, preferably, an area of a bottom surface of the LED structure connected to the first portion may be 25 $\mu m^2$ or less, and when the area of the bottom surface exceeds 25 $\mu m^2$, it may be difficult to separate LEDs through operation (2) to be described below.

The plurality of LED structures may include the doped n-type III-nitride semiconductor layer 10 at the lower end portions thereof, and various semiconductor layers and electrode layers provided in a typical LED element may be provided above the doped n-type III-nitride semiconductor layer 10, and for example, each of the plurality of LED structures may further include a photoactive layer 20, a p-type III-nitride semiconductor layer 30, and a first electrode layer 40 stacked on the second portion b of the doped n-type III-nitride semiconductor layer 10. In addition, the doped n-type III-nitride semiconductor layer 10 may further include a substrate 1 that is provided in a typical wafer.

The doped n-type III-nitride semiconductor layer 10 includes Group III-V semiconductors, in particular binary, ternary, and quaternary alloys of gallium, aluminum, indium, and nitrogen, also referred to as III-nitride materials. As an example, the n-type III-nitride semiconductor layer 10 may include a semiconductor material having a composition formula of $In_xAl_yGa_{1-x-y}N$ ($0<=x<=1$, $0<=y<=1$, and $0<=x+y<=1$), for example, at least one selected from among InAlGaN, GaN, AlGaN, InGaN, AlN, InN, and the like. In addition, the n-type III-nitride semiconductor layer is essentially a semiconductor layer doped with a first conductive dopant (e.g., Si, Ge, Sn, or the like), and due to the first conductive dopant, pores may be formed in the n-type III-nitride semiconductor layer 10 through operation (2) to be described below. Meanwhile, a thickness of the doped n-type III-nitride semiconductor layer 10 in the wafer may be in a range of 0.5 μm to 4 μm, and a thickness of the second portion b of the doped n-type III-nitride semiconductor layer 10 in each LED structure may be in a range of 0.5 μm to 4 μm.

Further, the photoactive layer 20 may be a photoactive layer provided in a typical LED, and may be formed in a single or multiple quantum well structure. A photoactive layer included in a typical LED element used for lighting, a display, and the like may be used as the photoactive layer 20 without limitation. A clad layer (not shown) doped with a conductive dopant may be formed on and/or below the photoactive layer 20, and the clad layer doped with the conductive dopant may be implemented as an AlGaN layer or an InAlGaN layer. In addition, a material such as AlGaN or AlInGaN may be used for the photoactive layer 20. In the photoactive layer 20, when an electric field is applied to an element, electrons and holes moving from the semiconductor layers positioned above and below the photoactive layer to the photoactive layer are recombined to generate electron-hole pairs in the photoactive layer, thereby emitting light. According to one exemplary embodiment of the present disclosure, a thickness of the photoactive layer 20 may be in a range of 30 nm to 300 nm, but the present disclosure is not limited thereto.

Further, as the p-type III-nitride semiconductor layer 30 stacked on the photoactive layer 20, an p-type III-nitride semiconductor layer provided in a typical LED may be used without limitation, and as an example, a semiconductor material having a composition formula of $In_xAl_yGa_{1-x-y}N$ ($0<=x<=1$, $0<=y<=1$, and $0<=x+y<=1$), for example, at least one selected from among InAlGaN, GaN, AlGaN, InGaN, AlN, InN, and the like may be used. In addition, a second conductive dopant (e.g., Mg) may be doped. According to one exemplary embodiment of the present disclosure, a thickness of the p-type III-nitride semiconductor layer 30 may be in a range of 0.01 μm to 0.30 μm, but the present disclosure is not limited thereto.

Figure 3:
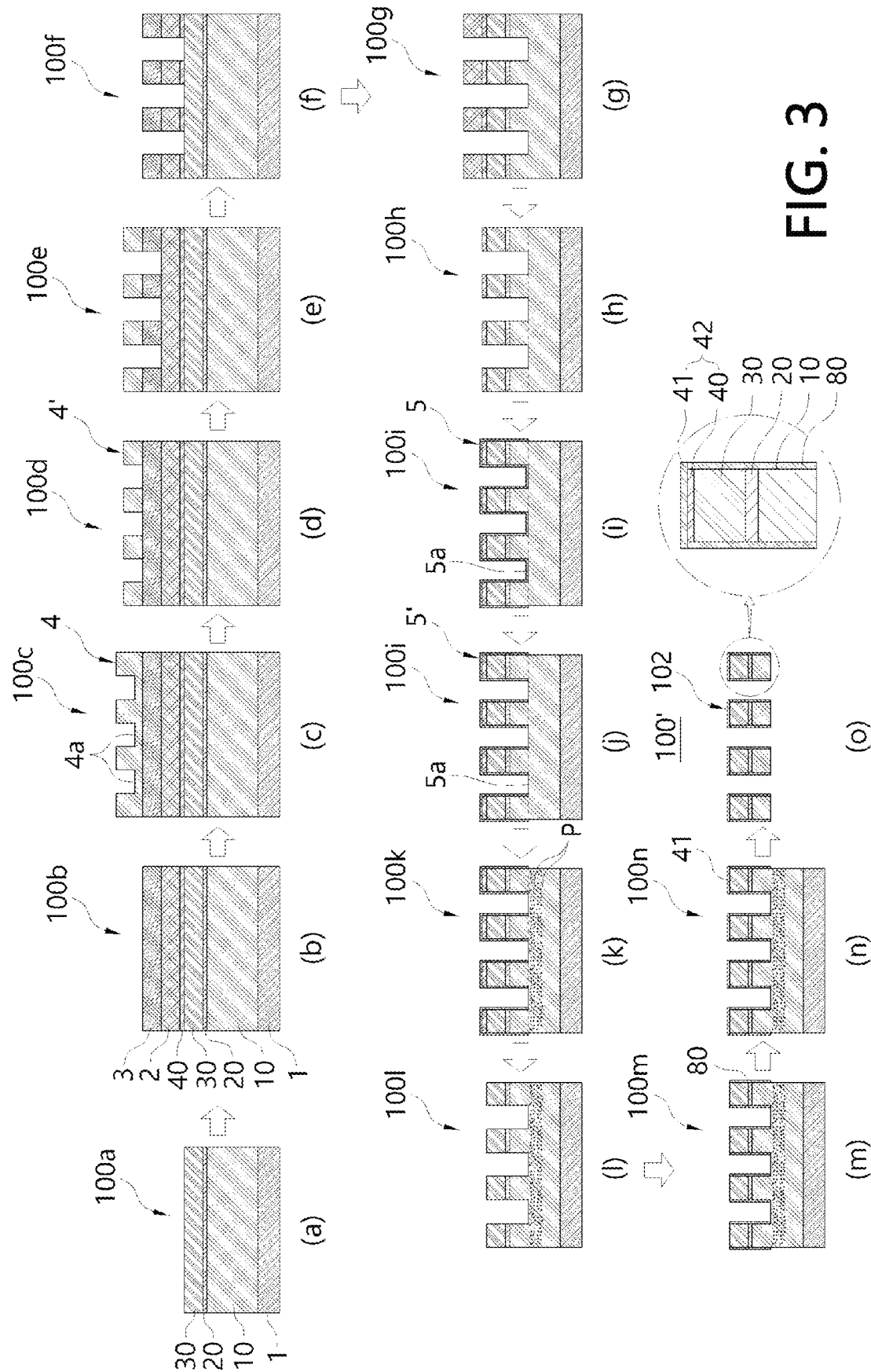
FIG. 3 is a set of schematic views of a process of separating light-emitting diodes (LED) structures according to one embodiment of the present disclosure, and is a set of schematic views of the entire process of manufacturing a plurality of individually separated LED structures from an LED wafer.

Further, an electrode layer employed in a typical LED element may be used without limitation as the first electrode layer 40 formed on the p-type III-nitride semiconductor layer 30. As the first electrode layer 40, a material such as Cr, Ti, Al, Au, Ni, ITO, and an oxide or alloy thereof may be used alone or in combination, or those in which each of these materials forms a layer and the formed layer is stacked may be used. Preferably, a transparent material may be used to minimize emission loss, and accordingly, as an example, ITO or a first electrode composite layer 42 in which the first electrode layer 40, which is an ITO layer, and a metal electrode layer 41, which is an Au layer, are stacked as shown in FIG. 3 may be used. In addition, a thickness of each of the first electrode layer 40 and the first electrode composite layer 42 may be independently in a range of 50 to 500 nm, but the present disclosure is not limited thereto.

Further, the above-described n-type III-nitride semiconductor layer 10, photoactive layer 20, and p-type III-nitride semiconductor layer 30 may be included as minimum components of the LED structure, and another phosphor layer, quantum dot layer, active layer, semiconductor layer, hole blocking layer, and/or electrode layer may be further included above/below each layer.

According to one embodiment of the present disclosure, the LED wafer $100h_1$ on which the plurality of LED structures are formed may be formed by operations, as illustrated in FIGS. 3A to 3H, including operation (a) of preparing the LED wafer 100a including the substrate 1, and the doped n-type III-nitride semiconductor layer 10, the photoactive layer 20, and the p-type III-nitride semiconductor layer 30, which are stacked on the substrate 1 (see FIG. 3A), and operation (b) of patterning an upper portion of the LED wafer such that the planar surface perpendicular to a direction, in which the layers in the individual LED structure are stacked, has a desired shape and size (see FIGS. 3B and 3C), and forming the plurality of LED structures by vertically etching the doped n-type III-nitride semiconductor layer to at least a partial thickness (see FIGS. 3D to 3G).

A wafer that is commercialized and available may be used as the LED wafer 100a provided in operation (a) without limitation. In addition, after the n-type III-nitride semiconductor layer is etched to a desired thickness, since the LED structures remaining on the LED wafer after the etching may be separated through a separation method according to the present disclosure to be described below, a thickness of the n-type III-nitride semiconductor layer 10 in the LED wafer is also not limited, and the presence or absence of a separate sacrificial layer may not be considered when a wafer is selected. In addition, each layer in the LED wafer 100a may have a c-plane crystal structure. In addition, the LED wafer 100a may be subjected to a cleaning process, and since a typical cleaning process and cleaning solution of a wafer may be appropriately applied in the cleaning process, the present disclosure is not particularly limited in this respect. The cleaning solution may be, for example, at least one selected from among isopropyl alcohol, acetone, and hydrochloric acid, but the present disclosure is not limited thereto.

Next, before operation (b) is performed, an operation of forming the first electrode layer 40 on the p-type III-nitride semiconductor layer 30 may be performed. The first electrode layer 40 may be formed through a typical method of forming an electrode on a semiconductor layer and may be formed by, for example, deposition through sputtering.

The material of the first electrode layer 40 may be, for example, ITO as described above, and the first electrode layer 40 may be formed to have a thickness of about 150 nm. The first electrode layer 40 may be further subjected to a rapid thermal annealing process after a deposition process. As an example, the first electrode layer 40 may be processed at a temperature of 60° C. for 10 minutes. However, since the rapid thermal annealing process may be appropriately adjusted in consideration of the thickness and material of the electrode layer, the present disclosure is not particularly limited in this respect.

Next, in operation (b), the upper portion of the LED wafer may be patterned such that the planar surface perpendicular to a direction in which the layers are stacked in the individual LED structure has a desired shape and size (see FIGS. 3B to 3F). Specifically, a mask pattern layer may be formed on an upper surface of the first electrode layer 40, and the mask pattern layer may be formed using a known method and material used in etching an LED wafer. A pattern of the pattern layer may be formed by appropriately applying a typical photolithography method or nanoimprinting method.

As an example, the mask pattern layer may be a stack of a first mask layer 2, a second mask layer 3, and a resin pattern layer 4', which form a predetermined pattern on the first electrode layer 40 as shown in FIG. 3F. When briefly describing a method of forming the mask pattern layer, as an example, the first mask layer 2 and the second mask layer 3 may be formed on the first electrode layer 40 through deposition, a resin layer 4, which is an origin of the resin pattern layer 4', may be formed on the second mask layer 3 (see FIGS. 3B and 3C), a residual resin portion 4a of the resin layer 4 may be removed through a typical method such as a reactive ion etching (RIE) method (see FIG. 3D), and then the second mask layer 3 and the first mask layer 2 may be sequentially etched (see FIGS. 3E and 3F) along a pattern of the resin pattern layer 4' to form the mask pattern layer. In this case, the second mask layer 3 may be a metal layer made of aluminum, nickel, or the like, and the first mask layer 2 may be made of, for example, silicon dioxide. The first mask layer 2 and the second mask layer 3 may be etched through an inductively coupled plasma (ICP) method and an RIE method. Meanwhile, when the first mask layer 2 is etched, the resin pattern layer 4' may also be removed (see 100f in FIG. 3).

Figure 4:
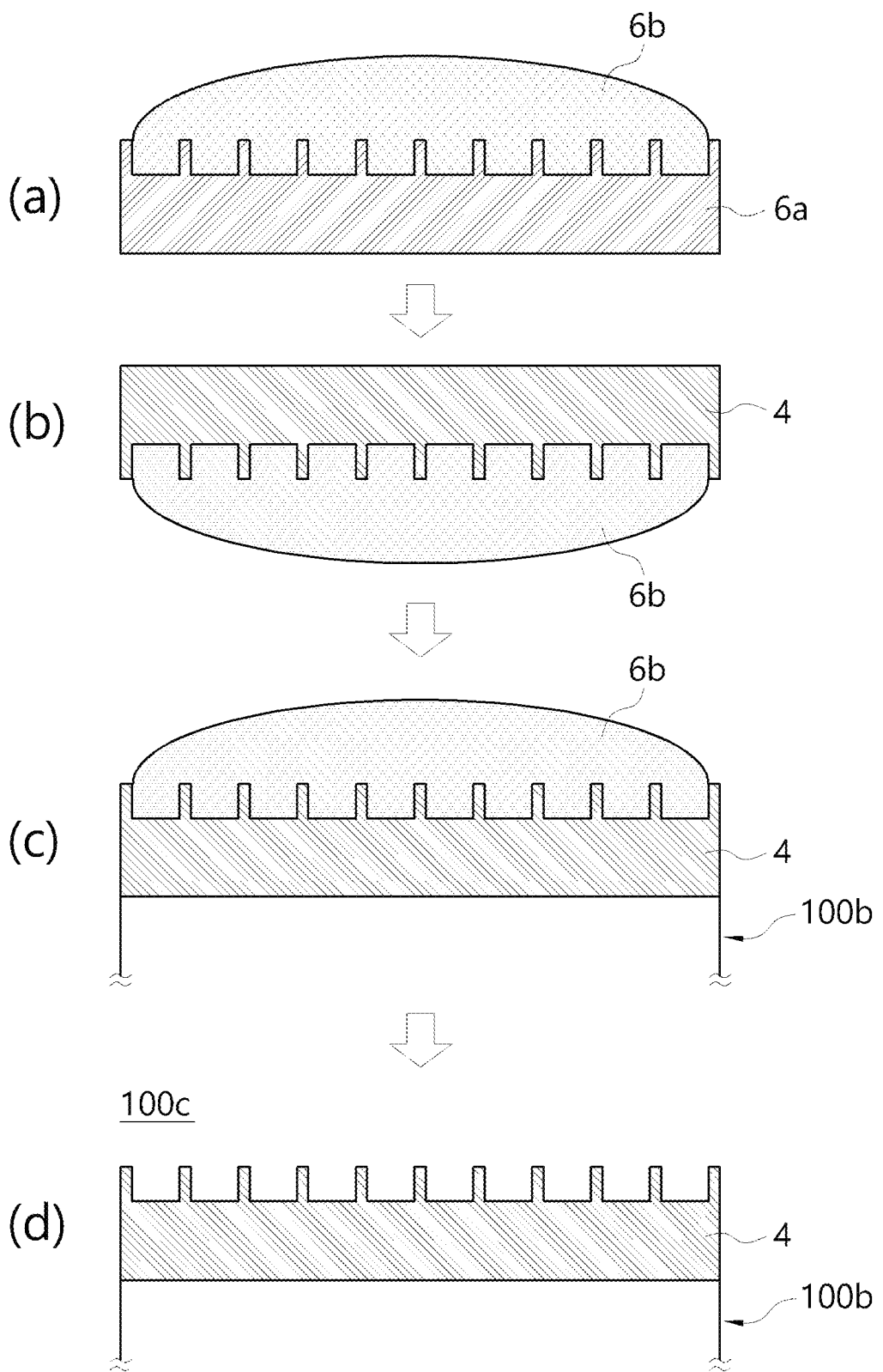
FIG. 4 is a set of schematic views of a manufacturing process of a resin layer included in one embodiment of the present disclosure.

Meanwhile, the resin layer 4, which is the origin of the resin pattern layer 4', may be formed through a nanoimprinting method as shown in FIG. 4. And, after manufacturing a mold 6b corresponding to a desired predetermined pattern mold 6a (see FIG. 4A), the mold 6b may be treated with a resin to form the resin layer 4 (see FIG. 4B), the resin layer 4 may be transferred so as to be positioned on a wafer stack 100b in which the first mask layer 2 and the second mask layer 3 are formed on the first electrode layer 40, and then the mold 6b may be removed to implement a wafer stack 100c on which the resin layer 4 is formed.

Meanwhile, although the method of forming a pattern through the nanoimprinting method has been described, the present disclosure is not limited thereto, and a pattern may also be formed through known photolithography using a photosensitive material or may be formed through known laser interference lithography, electron beam lithography, or the like.

Thereafter, as shown in FIG. 3G, the n-type III-nitride semiconductor layer 10 may be vertically etched to a partial thickness in a direction perpendicular to a surface of an LED wafer 100f along a pattern of the mask pattern layers 2 and 3 formed on the first electrode layer 40, thereby forming an LED wafer 100g on which the LED structures are formed. In this case, the etching may be performed through typical dry etching such as ICP and KOH/TMAH wet etching. In such an etching process, the second mask layer 3 made of aluminum constituting the mask pattern layer may be removed, and then, the first mask layer 2, which is made of silicon dioxide constituting the mask pattern layer present on the first electrode layer 40 of each LED structure in the LED wafer 100g, may be removed to manufacture an LED wafer 100h on which the plurality of LED structures, on which operation (1) according to the present disclosure is performed, are formed.

As operation (1) according to the present disclosure, an operation of forming a protective film 80a so as to surround the exposed surface of each of the plurality of LED structures with a predetermined thickness in the LED wafer 100h on which the plurality of prepared LED structures are formed and expose an upper surface S1 of the first portion a between the adjacent LED structures to the outside is performed (see FIG. 1B). The protective film 80a is for preventing damage to the LED structure due to the performing of operation (2) to be described below. In addition, when the protective film 80a continues to remain on a side surface of the LED structure separated from the LED wafer, the protective film 80*a* may also perform a function of protecting a side surface of the individually separated LED structure from external stimuli.

Specifically, operation (1) may be performed by depositing a protective film material on the LED wafer 100*h*, on which the plurality of LED structures are formed, to form the protective film 80*a* to a predetermined thickness so as to surround the exposed surface of each of the plurality of LED structures (operation 1-1), and removing the protective film deposited on the upper surface S1 of the first portion a between the adjacent LED structures to expose the upper surface S1 of the first portion a between the LED structures to the outside (operation 1-2).

Operation 1-1 is an operation of depositing the protective film material on the LED wafer 100*h* on which the plurality of LED structures are formed. Here, the protective film material may be a known material that is not chemically affected by the electrolyte of operation 2 to be described below, and as an example, the protective film material may include at least one selected from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), lanthanum oxide ($La_2O_3$), scandium oxide ($Sc_2O_3$), titanium dioxide ($TiO_2$), aluminum nitride (AlN), and gallium nitride (GaN). In addition, a thickness of the protective film 80*a* formed by depositing the protective film material may be in a range of 5 nm to 100 nm. When the thickness of the protective film 80*a* is less than 5 nm, it may be difficult to prevent the LED structure from being damaged by the electrolyte in operation (2) to be described below, and when the thickness of the protective film 80*a* exceeds 100 nm, there may be problems in that manufacturing costs are increased and the LED structures are connected.

Next, operation 1-2 is an operation of removing the protective film deposited on the upper surface S1 of the first portion a between the adjacent LED structures to expose the upper surface S1 of the first portion a between the LED structures to the outside. Due to the performing of operation 1-1, the protective film material is also deposited on the upper surface S1 of the first portion a between the adjacent LED structures, and thus, since the electrolyte may not come into contact with the n-type III-nitride semiconductor layer 10, desired pores may not be formed in the first portion a. Thus, an operation of removing the protective film material applied on the upper surface S1 of the first portion a to expose the upper surface S1 of the first portion a to the outside may be performed, and in this case, the removing of the protective film material may be performed through a known dry or wet etching method in consideration of the protective film material.

Meanwhile, according to one embodiment of the present disclosure, the protective film formed in operation (1) may be a temporary protective film for preventing damage to the LED structure due to the performing of operation (2), and an operation of forming a surface protective film surrounding the side surface of the LED structure after the temporary protective film is removed may be further included between operation (2) and operation (3). That is, the above-described protective film 80*a* may remain even after operation (2) and perform a function of preventing damage to the LED structure in operation (2) as well as damage to the surface of the LED structure after operation (2). On the other hand, in some embodiments, the protective film in operation (1) may be provided only as a temporary protective film to prevent damage to the LED structure in operation (2) and is removed before operation (3) is performed, and then a surface protective film for performing a function of preventing damage to the surface of the LED structure may be formed to cover the side surface of the LED structure. As described above, in some embodiments, there is inconvenience in that the protective film is formed twice, but the protective film may be selected in consideration of the planar shape and size of the LED structures to be manufactured, and the interval between the LED structures. In addition, when operation (2) to be described below is performed, the protective film may be partially damaged, and since there may be a case in which, when the damaged protective film is left on the finally obtained individual LED structure and used as a surface protective film, it is difficult for the damaged protection film to properly perform a surface protection function, in some cases, it may be advantageous to remove the protective film subjected to operation (2) and then provide a protective film again.

When describing the manufacturing process in some embodiments with reference to FIG. 3, through FIGS. 3I and 3J, a temporary protective film 5 is deposited on the LED wafer 100*h* on which the plurality of LED structures are formed, and then the temporary protective film material, which is deposited on the upper surface S1 of the first portion a of the doped n-type III-nitride semiconductor layer 10 between the adjacent LED structures of an LED wafer 100*i* on which the temporary protective film 5 is deposited, may be etched to form a temporary protective film 5' that protects the side surfaces and upper portions of the plurality of LED structures. Next, after operation (2) to be described below is performed (see FIG. 3K), the temporary protective film 5' may be removed through etching (see FIG. 3L), a protective film material may be deposited on an LED wafer 100l as a surface protective film for protecting the surface of the LED structure, and then, the protective film material formed on each of the LED structures may be removed to form a protective film 80 surrounding the side surfaces of the LED structure (see FIG. 3M). In this case, the protective film material formed on the LED structures may be removed together with the protective film material deposited on the upper surface S1 of the first portion a of the doped n-type III-nitride semiconductor layer 10 between adjacent LED structures of the LED wafer 100l. Thus, in operation (3) to be described below, a bubble-forming solution may come into contact with the upper surface S1 of the first portion a, and bubbles generated through ultrasonic waves may penetrate into pores P formed in the first portion a so that the LED structures may be separated through the bubbles.

Meanwhile, descriptions of the temporary protective film material and the surface protective film material are the same as those of the material of the above-described protective film, and an implemented film thickness may also be implemented within a thickness range of the above-described protective film.

Next, as operation (2) of the present disclosure, an operation of immersing the LED wafer in the electrolyte, electrically connecting the LED wafer to one terminal of the power supply, electrically connecting the other electrode of the power supply to the electrode immersed in the electrolyte, and then applying power to form the plurality of pores in the first portion is performed.

Figure 2:
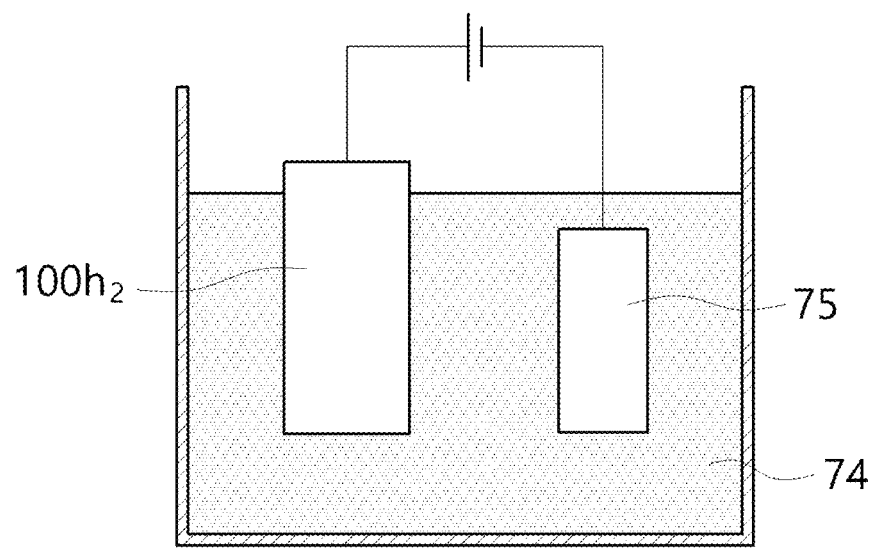
FIG. 2 is a schematic view illustrating a method of forming a plurality of pores in a doped n-type III-nitride semiconductor layer, which is performed in one embodiment of the present disclosure.

Specifically, as shown in FIGS. 1 and 2, an LED wafer 100*h_2* on which the protective film 80*a* is formed may be electrically connected to one terminal of the power supply, for example, an anode, and the other terminal of the power supply, for example, a cathode, may be electrically connected to an electrode 75 immersed in an electrolyte 74, and then, power may be applied, thereby manufacturing an LED wafer $100h_3$ in which a plurality of pores P are formed in the first portion a of the doped n-type III-nitride semiconductor layer. In this case, the pores P may start to be formed from the upper surface S1 of the first portion a of the doped n-type III-nitride semiconductor layer in direct contact with the electrolyte, and may be formed in a thickness direction and a direction toward a side surface of the first portion a corresponding to a lower portion of each of the plurality of LED structures.

The electrolyte used in operation (2) may be preferably an oxyacid, and specifically, the electrolyte may include at least one selected from the group consisting of oxalic acid, phosphoric acid, sulfurous acid, sulfuric acid, carbonic acid, acetic acid, chlorous acid, chloric acid, bromic acid, nitrous acid, and nitric acid, and more preferably, oxalic acid may be used. Accordingly, there is an advantage of being suitable for forming pores without damaging the LED structure. In addition, the electrode may be made of platinum (Pt), carbon (C), nickel (Ni), gold (Au), or the like and may be, for example, a platinum electrode. In addition, in operation (2), a voltage of 3 V or more may be applied as power for 1 minute to 24 hours, and thus, the pores P can be smoothly formed up to the first portion a corresponding to the lower portion of each of the plurality of LED structures. Accordingly, the LED structure may be more easily separated from the wafer through operation (3). More preferably, a voltage of 10 V or more may be applied, and more preferably, a voltage of 30 V or less may be applied. When a voltage of less than 3 V is applied, even when an application time of power is increased, pores may not be smoothly formed in the first portion a corresponding to the lower portion of each of the LED structures, and thus, it may be difficult to separate the LED structures through operation (3) to be described below, or even though the LED structures are separated, separated cross sections of the plurality of LED structures may have different shapes, which may make it difficult for the plurality of LED structures to exhibit uniform characteristics. In addition, when a voltage exceeding 15 V is applied, pores may be formed up to the second portion b which is the lower end portion of the LED structure connected to the first portion a of the doped n-type III-nitride semiconductor layer, thereby causing the deterioration of emission properties. In addition, it is preferable that the separation of the LED structure in operation (3) to be described below is performed at a boundary point between the first portion a of the doped n-type III-nitride semiconductor layer and the second portion b, but due to pores formed in the second portion b, separation may occur at any point of the second portion b beyond the boundary point, which may cause a risk of obtaining an LED structure including an n-type semiconductor layer with a thickness less than that of an initially designed n-type semiconductor layer. In addition, similarly to an effect according to a strength of a voltage, when an application time of power is increased, pores are likely to be formed in the second portion b other than a desired portion, and conversely, when the application time is decreased, pores may not be smoothly formed, and thus, it may be difficult to separate the LED structures.

In addition, an average diameter of the plurality of pores is 100 nm or less. Accordingly, the LED structure may be more easily separated from the wafer through operation (3).

After operation (2) and before operation (3) to be described below, an operation of manufacturing an LED wafer $100h_4$, in which the protective film formed on an upper surface of each of the LED structures among the protective film 80a is removed to enable an electrical connection to the first electrode layer 40 after the LED structure is separated from a wafer, may be further performed. In addition, since only the protective film formed on the upper surface of the LED structure is removed, the protective film 80 formed on the side surface of the LED structure may remain to perform a function of protecting the side surface of the LED structure from the outside.

In addition, after operation (2) and before operation (3) to be described below, an operation of forming another layer on the first electrode layer 40 of the LED structure may be further performed, and the other layer may be, for example, the metal electrode layer 41 (see FIG. 3N).

Next, as operation (3) according to the present disclosure, an operation of applying ultrasonic waves to the LED wafer $100h_4$ to separate the plurality of LED structures from the first portion a in which the plurality of pores P are formed is performed.

In this case, the ultrasonic waves may be applied directly to the LED wafer $100h_4$ in which the pores are formed or may be applied indirectly by immersing the LED wafer $100h_4$, in which the pores are formed, in a solvent. However, in a method of collapsing the pores using a physical external force caused by the ultrasonic wave itself, the collapse of the pores is not smooth, and when the pores are excessively formed to facilitate the collapse, the pores are likely to be formed up to the second portion b of the LED structure, which may cause a side effect of reducing the quality of the LED structure.

Accordingly, according to one embodiment of the present disclosure, operation (3) may be performed using a sonochemical method. Specifically, after the LED wafer $100h_4$ is immersed in a bubble-forming solution (or solvent) 76, ultrasonic waves are applied to the bubble-forming solution (or solvent) 76 to collapse the pores through energy generated when bubbles generated and grown through a sonochemical mechanism burst in the pores, thereby separating the plurality of LED structures. Specifically, ultrasonic waves alternately generate a relatively high pressure portion and a relatively low pressure portion in a traveling direction of a sound wave. In this case, generated bubbles pass through the high pressure portion and the low pressure portion and repeatedly contract and expand to grow into bubbles with a higher temperature and high pressure and then collapse, and when the bubbles collapse, as an example, the bubbles become local hot spots that generate a high temperature of 4,000 K and a high pressure of 1,000 atm. Therefore, by using such energy, the pores generated in the LED wafer may be collapsed to separate the LED structure from the wafer. After all, the ultrasonic waves only perform a function of generating and growing bubbles in the bubble-forming solution (or solvent) and moving and penetrating the generated bubbles into the pores P of the first portion a. Thereafter, through a pore collapse mechanism in which the pores P are collapsed by an external force generated at the time of the bursting of the bubbles in an unstable state with a high temperature and high pressure, which have penetrated into the pores P, the plurality of LED structures may be easily separated from the LED wafer.

A solution (or solvent) capable of generating bubbles when ultrasonic waves are applied and growing to have a high pressure and temperature may be used as the bubble-forming solution (or solvent) 76 without limitation, and preferably, the bubble-forming solution (or solvent) may have a vapor pressure of 100 mmHg or less (at 20° C.), for example, a vapor pressure of 80 mmHg or less (at 20° C.), a vapor pressure of 60 mmHg or less (at 20° C.), a vapor pressure of 50 mmHg or less (at 20° C.), a vapor pressure of 40 mmHg or less (at 20° C.), a vapor pressure of 30 mmHg or less (at 20° C.), a vapor pressure of 20 mmHg or less (at 20° C.), or a vapor pressure of 10 mmHg or less (at 20° C.). When a solvent having a vapor pressure exceeding 100 mmHg (at 20° C.) is used, separation may not occur properly within a short time, which may cause concerns that a manufacturing time is increased and production costs are increased. The bubble-forming solution (or solvent) 76 satisfying such physical properties may include, for example, at least one selected from the group consisting of gamma-butyllactone, propylene glycol methyl ether acetate, methyl pyrrolidone, and 2-methoxyethanol. Meanwhile, a solution (or solvent) having a vapor pressure of 100 mmHg at room temperature, for example, 20° C., may be used as the bubble-forming solution (or solvent), but alternatively, by adjusting conditions for performing operation (3), operation (3) may be performed by adjusting a vapor pressure of the bubble-forming solution (or solvent) so as to be 100 mmHg or less under the above conditions (for example, low temperature conditions). In this case, restrictions on types of usable solvents may be wider, and as an example, solvents such as water, acetone, and alcohols may be used.

In addition, a wavelength of an ultrasonic wave applied in operation (3) may be in a range capable of causing a sonochemical effect, and specifically, the ultrasonic wave may be applied at a frequency capable of growing and collapsing bubbles so as to become local hot spots that generate a high pressure and temperature when the bubbles are collapsed. As an example, the frequency may be in a range of 20 kHz to 2 MHz, and an application time of the applied ultrasonic wave may be in a range of 1 minute to 24 hours, thereby making it easy to separate the LED structure from the LED wafer. Even when a wavelength of an applied ultrasonic wave falls within the range, when an intensity of the applied ultrasonic wave is low or an application time thereof is short, there is a concern that there are LED structures that are not separated from the LED wafer or the number of LED structures that are not separated from the LED wafer is increased. In addition, when the intensity of the applied ultrasonic wave is high or the application time is long, the LED structure may be damaged.

Figure 5:
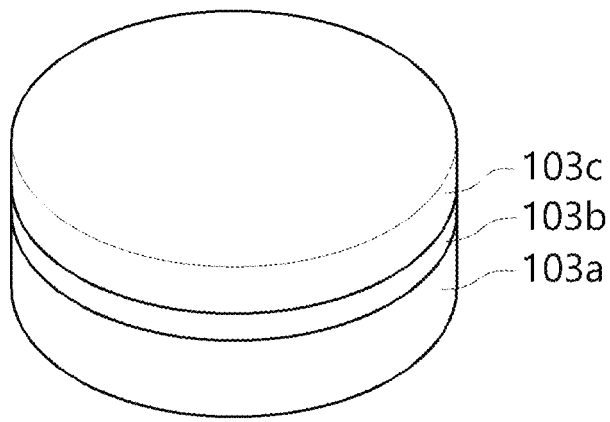
FIGS. 5 to 7 are perspective views of various shapes of LED structures separated by one embodiment of the present disclosure.
Figure 6:
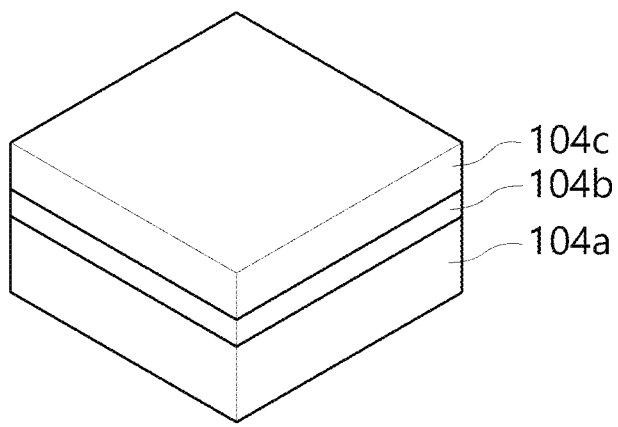
Figure 7:
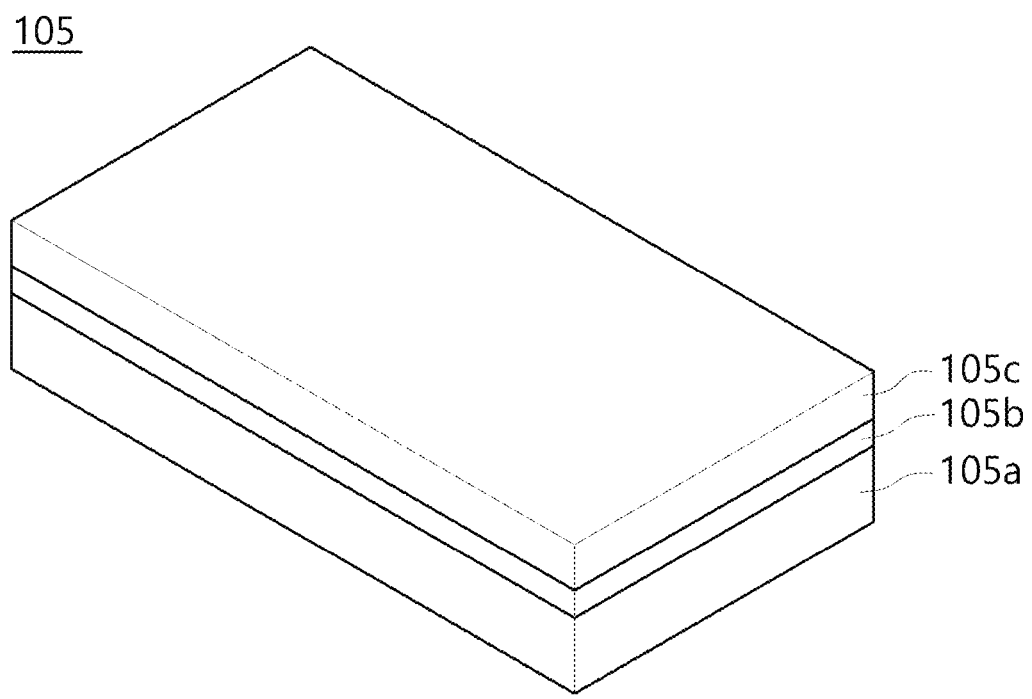

Further, the present disclosure may obtain LED structure aggregates 100 and 100' respectively including a plurality of individual LED structures 101 and a plurality of individual LED structures 102 separated from an LED wafer through the above-described method. As shown in FIGS. 5 to 7, implemented LED structures 103, 104, and 105 may respectively include doped n-type III-nitride semiconductor layers 103a, 104a, and 105a, photoactive layers 103b, 104b and 105b, p-type III-nitride semiconductor layers 103c, 104c, and 105c, and protective films (not shown) each surrounding side surfaces of each of the LED structures. In addition, a shape of each of the LED structures 103, 104, and 105 may be a cylindrical shape (FIG. 5), a cube shape (FIG. 6), or a rectangular parallelepiped shape (FIG. 7) extending in one direction. In addition, the cylindrical LED structure may also be implemented in the form of a cable having a height greater than a diameter and in the form of a disk having a diameter greater than a height.

Further, in the case of the LED structure 103 with a cylindrical shape, the implemented individual LED structure may have, for example, a diameter of 0.5 to 5 μm and a height of 0.5 to 5 μm. In the case of the LED structure 104 with a cubic shape, the implemented individual LED structure may have, for example, a one side length of 0.5 to 5 μm. In the case of the rectangular parallelepiped-shaped LED structure, the implemented individual LED structure may have, for example, a long side length of 0.5 to 10 μm and a short side length of 0.5 to 5 μm of a top or bottom surface and a height of 0.5 to 4 μm.

The present disclosure will be described in more detail through the following Examples, but the following Examples do not limit the scope of the present disclosure, and it should be understood that the following Examples are intended to assist the understanding of the present disclosure.

EXAMPLE 1

Figure 8:
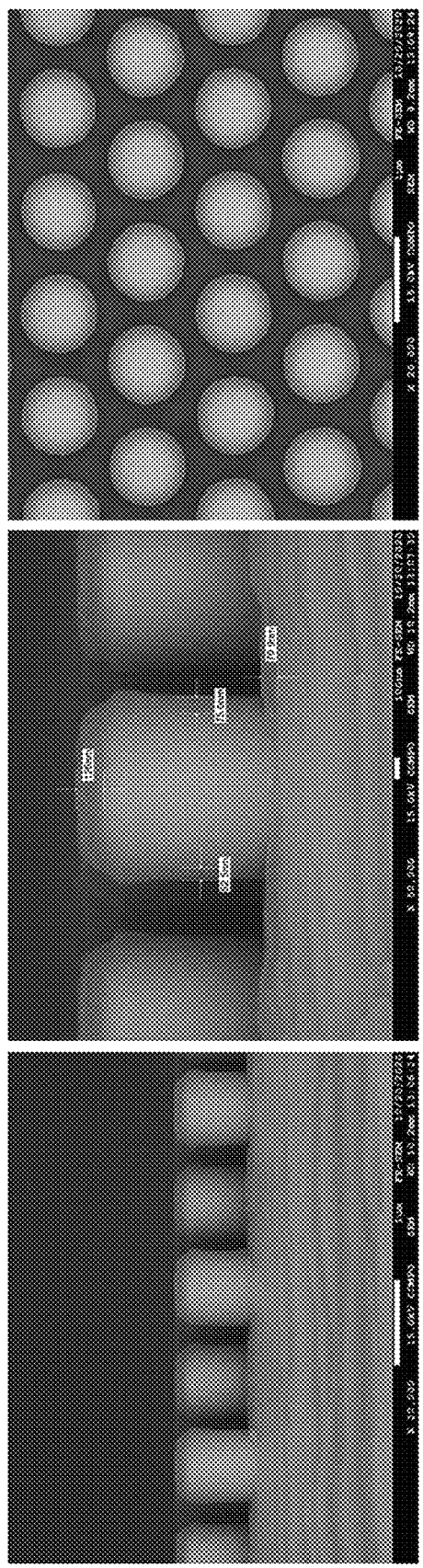
FIGS. 8 to 11 are SEM images at specific stages of an LED structure separation process according to Example 1.

A typical LED wafer (manufactured by Epistar Corporation), in which an undoped n-type III-nitride semiconductor layer, an n-type III-nitride semiconductor layer doped with S1 (with a thickness of 4 μm), a photoactive layer (with a thickness of 0.45 μm), and a p-type III-nitride semiconductor layer (with a thickness of 0.05 μm) are sequentially stacked on a substrate, was prepared. ITO (with a thickness of 0.15 μm) as a first electrode layer, $SiO_2$ (with a thickness of 1.2 μm) as a first mask layer, and Al (with a thickness of 0.2 μm) as a second mask layer were sequentially deposited on the prepared LED wafer, and then a spin-on-glass (SOG) resin layer onto which a pattern is transferred was transferred onto the second mask layer using nanoimprint equipment. Thereafter, the SOG resin layer was cured using RIE, and a residual resin portion of the resin layer was etched through RIE to form a resin pattern layer. After that, the second mask layer was etched along the pattern using ICP, and the first mask layer was etched using RIE. Next, after the first electrode layer, the p-type III-nitride semiconductor layer, and the photoactive layer were etched using ICP, the doped n-type III-nitride semiconductor layer was etched to a thickness of 0.78 μm, and then, an LED wafer, on which a plurality of LED structures (with a diameter of 850 nm and a height of 850 nm) are formed through KOH wet etching so as to implement a side surface of the etched doped n-type III-nitride semiconductor layer so as to be perpendicular to a layer surface, was manufactured. After that, a $SiN_x$ protective film material was deposited on the LED wafer on which the plurality of LED structures are formed (deposition thicknesses of 52.5 nm and 72.5 nm from a side surface of the LED structure, see the scanning electron microscope (SEM) image of FIG. 8), and then, the protective film material formed between the plurality of LED structures was removed using a reactive ion etcher to expose an upper surface S1 of a first portion a of the doped n-type III-nitride semiconductor layer.

Figure 9:
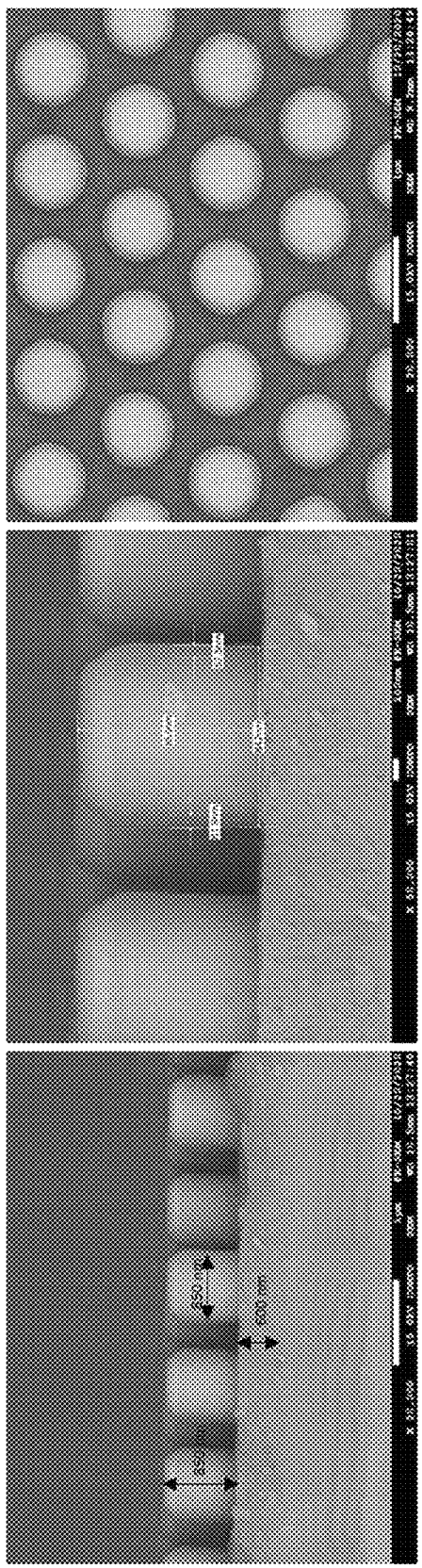
Figure 10:
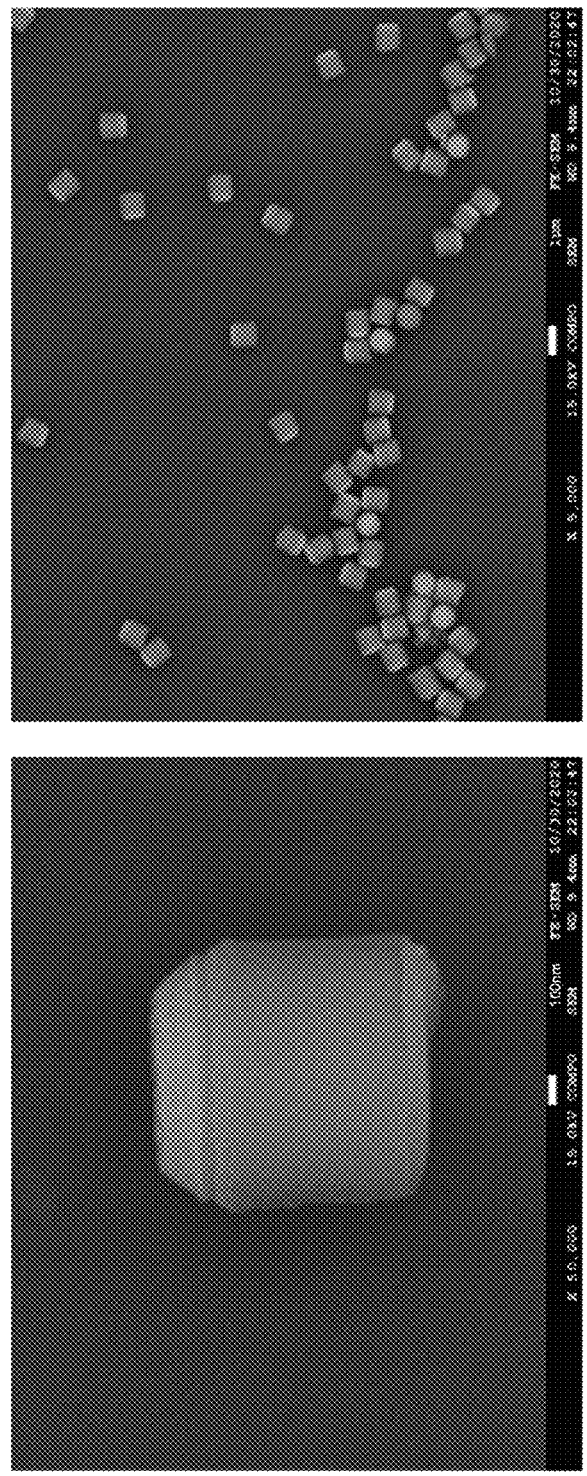

Thereafter, the LED wafer on which a protective film was formed was immersed in an electrolyte which is a 0.3M oxalic acid solution and connected to an anode terminal of a power supply, a cathode terminal was connected to a platinum electrode immersed in the electrolyte, and then, a voltage of 10 V was applied for 5 minutes to form a plurality of pores from the surface of the first portion a of the doped n-type III-nitride semiconductor layer to a depth of 600 nm as shown in the SEM image of FIG. 9. Thereafter, the protective film formed on upper portions of the plurality of LED structures was removed through RIE to expose the upper surface of the LED structure. Next, after the LED wafer was immersed in a bubble-forming solution of gamma-butyllactone, ultrasonic waves were radiated at an intensity of 40 kHz for 10 minutes to collapse the pores formed in the doped n-type III-nitride semiconductor layer using generated bubbles, thereby manufacturing the plurality of LED structures as shown in the SEM image of FIG.

Figure 11:
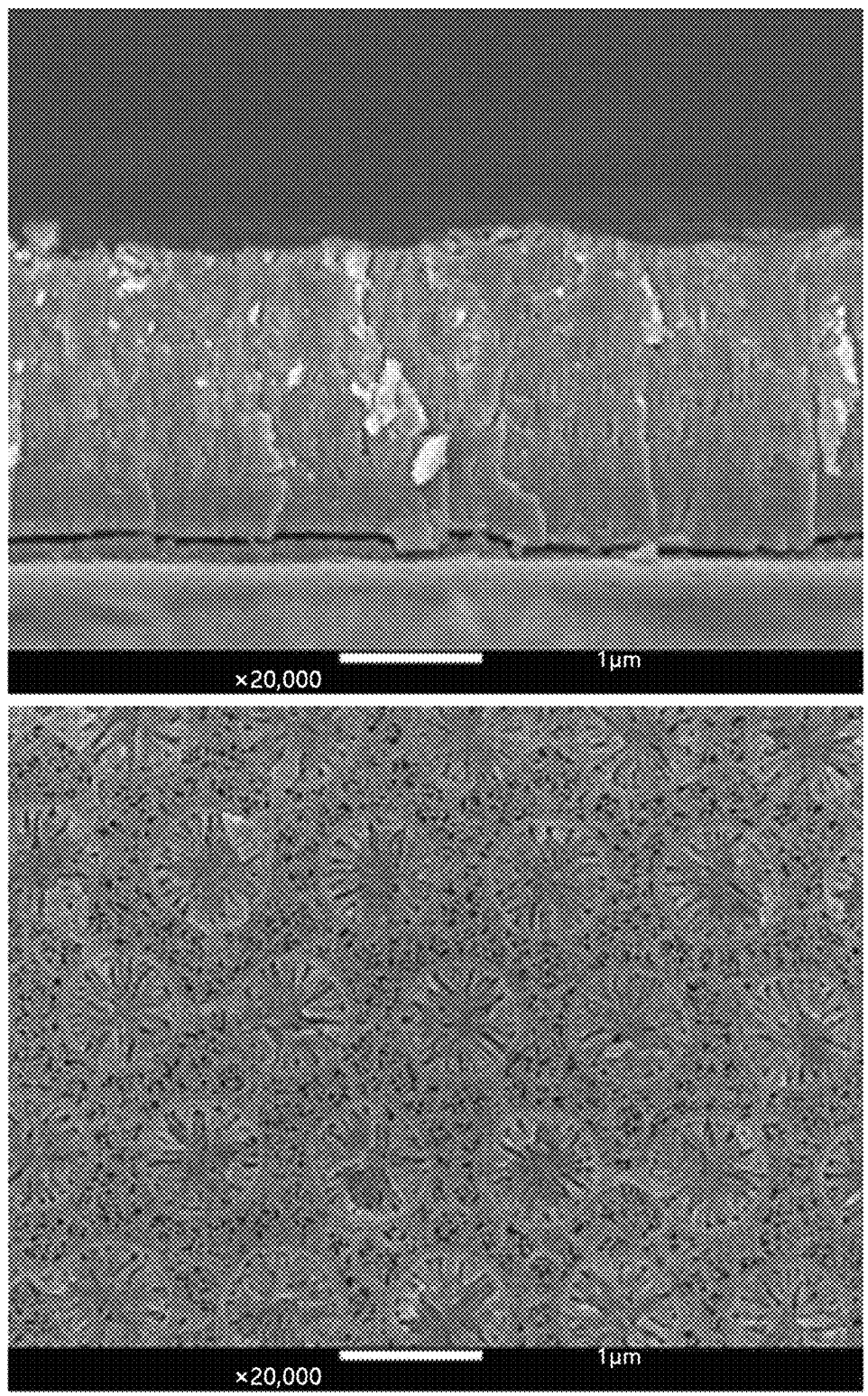

10. In addition, as shown in FIG. 11, it can be confirmed that there is no LED structure that is not separated from the wafer.

EXAMPLE 2

Figure 12:
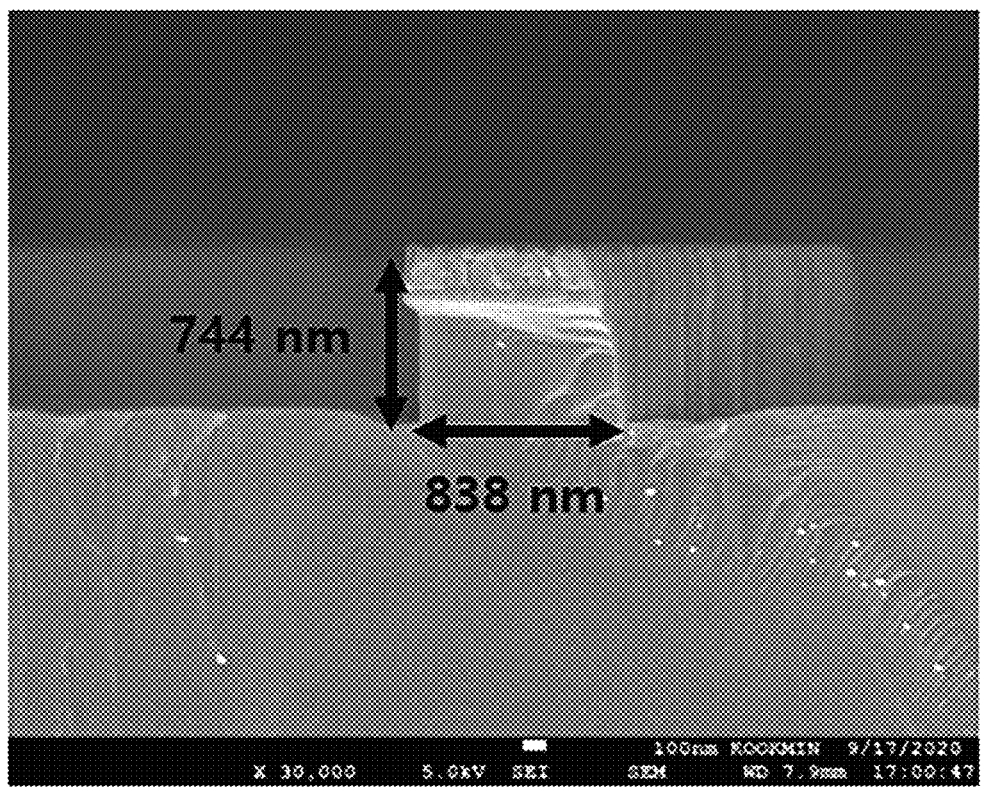
FIGS. 12 to 14 are SEM images at specific stages of an LED structure separation process according to Example 2.
Figure 13:
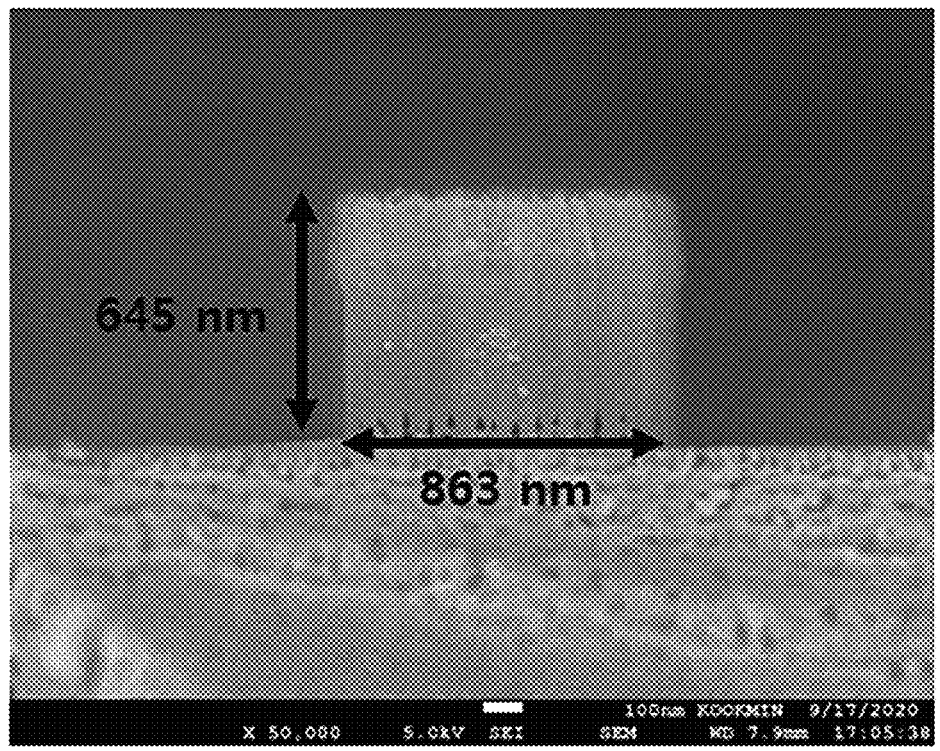
Figure 14:
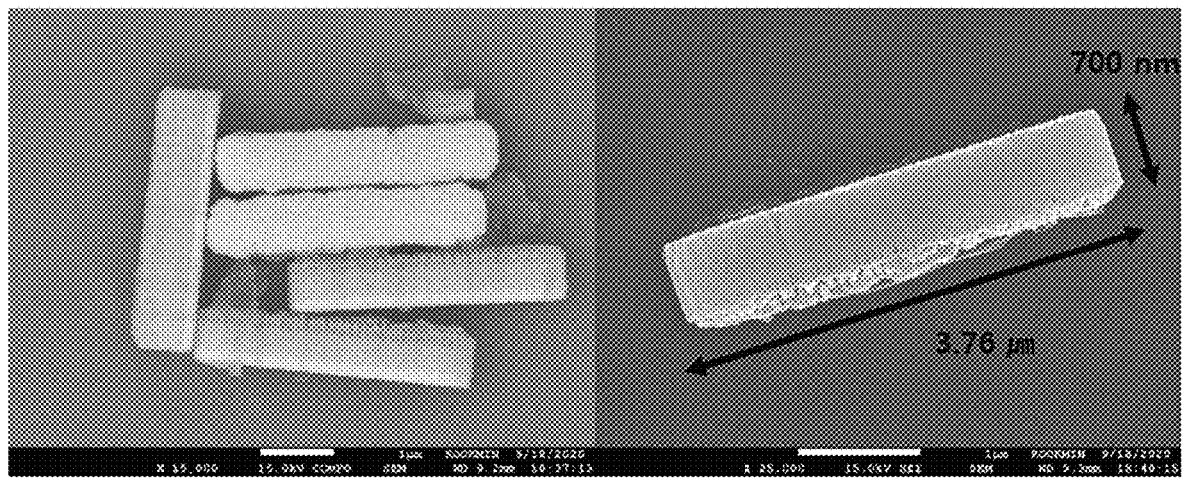

Example 2 is performed in the same manner as in Example 1 except that an SOG resin layer whose pattern was changed to change a shape of a pattern formed on an LED wafer so that an upper/lower shape of an LED structure became a rectangular shape was used, and a material of a second mask layer was changed to a nickel layer having a thickness of 80.6 nm. After that, the second mask layer was etched along the pattern using ICP in the same manner as in Example 1, and a first mask layer was etched using ME. Thereafter, a first electrode layer, a p-type III-nitride semiconductor layer, and a photoactive layer were etched using ICP, and subsequently, a doped n-type III-nitride semiconductor layer was etched to a thickness of 0.8 µm, and then a mask pattern layer was removed through KOH wet etching to manufacture an LED wafer on which a plurality of rectangular parallelepiped LED structures (each having a long side of 4 µm, a short side of 838 nm, and a height of 744 nm) are formed as shown in the SEM image of FIG. 12. Thereafter, $Al_2O_3$, as a protective film, was redeposited on the LED wafer with a thickness of about 60 nm from a side surface of an LED structure, and a surface protective film formed on the plurality of LED structures and a surface protective film formed on an upper surface S1 of a first portion a of the doped n-type III-nitride semiconductor layer were removed through RIE to expose the upper surface S1 of the first portion a of the doped n-type III-nitride semiconductor layer. Thereafter, the LED wafer was immersed in an electrolyte which is a 0.3M oxalic acid solution and connected to an anode terminal of a power supply, a cathode terminal was connected to a platinum electrode immersed in the electrolyte, and then, a voltage of 15 V was applied for 5 minutes to form a plurality of pores in a depth direction from the surface of the first portion a of the doped n-type III-nitride semiconductor layer as shown in the SEM image of FIG. 13. Thereafter, the protective film formed on upper portions of the plurality of LED structures was removed through ICP to expose the upper surface of the LED structure. Thereafter, the LED wafer was immersed in 100% gamma-butyllactone as a bubble-forming solution and then irradiated with ultrasonic waves at an intensity of 160 W, 60 Hz for 10 minutes to collapse the pores formed in the doped n-type III-nitride semiconductor layer using generated bubbles, thereby manufacturing the plurality of LED structures as shown in the SEM image of FIG. 14.

EXAMPLE 3

Example 3 was performed in the same manner as in Example 1 except that the bubble-forming solvent was changed to acetone to separate LED structures from a wafer.

EXAMPLE 4

Example 4 was performed in the same manner as in Example 1 except that the bubble-forming solvent was changed to water to separate LED structures from a wafer.

Experimental Example 1

The yield of the LED structures separated from the LED wafer by the separation method according to each of Examples 1, 3 and 4 was measured. The yield was calculated by comparing the number of LED structures present on the LED wafer before the separation and the number of LED structures remaining on the LED wafer after the separation, and calculating a separation yield obtained by counting the number of LED structures through the SEM images as a percentage, which is shown in Table 1 below.

TABLE 1

| | Example 1 | Example 3 | Example 4 |
|---|---|---|---|
| Bubble forming solvent | Gamma-butyllactone | Acetone | Water |
| Vapor pressure of bubble-forming solvent | 1.5 mmHg (20° C.) | 184 mmHg (20° C.) | 17.5 mmHg |
| Separation yield of LED structures (%) | 100% | 15% | 50% |

As can be seen from Table 1, it can be seen that the separation yield is very good in Example 1, whereas in the case of acetone and water, all the LED structures cannot be separated when the ultrasonic waves are applied for 10 minutes. This indicates that a solvent having an excellent bubble forming property may perform the separation more easily by a sonochemical principle.

According to a method of separating a plurality of LED structures from a wafer according to the present disclosure, the LED structures each having a desired size and shape can be easily separated from the wafer, using a commercialized wafer, without damage to the LED structures even without considering the presence or absence of a sacrificial layer and specifically pre-designing a thickness of semiconductor layers in the wafer from the time of wafer manufacturing. In addition, since a cutting defect in which separation occurs at a point other than a desired point when the LED structure is separated from the wafer can be prevented, a size between the plurality of obtained LED structures can be uniform, so that an LED structure aggregate, in which each of a plurality of LED structures is separated, exhibiting more uniform characteristics can be realized and can be widely applied as a material for displays and various light sources.

While the embodiments of the present disclosure have been described above, the present disclosure is not limited to the embodiments presented herein. One skilled in the art may easily suggest other embodiments due to addition, modification, deletion, and the like of components within the scope and spirit of the present disclosure, and the addition, modification, deletion, and the like of the components fall within the scope and spirit of the present disclosure.

What is claimed is:

1. A method of separating a plurality of light-emitting diode (LED) structures from an LED wafer on which the plurality of LED structures are formed, wherein the plurality of LED structures include a second portion of a doped n-type III-nitride semiconductor layer and the second portion is formed on and connected to a first portion of the doped n-type III-nitride semiconductor layer, the method comprising:

operation (1) of forming a protective film so as to surround an exposed surface of each of the plurality of LED structures but expose an upper surface of the first portion between adjacent LED structures to the outside;

operation (2) of immersing the LED wafer in an electrolyte, electrically connecting one terminal of a power supply to the LED wafer and the other terminal of the power supply to an electrode immersed in the electrolyte, and applying power to form a plurality of pores in the first portion; and operation (3) of applying ultrasonic waves to the LED wafer to separate the plurality of LED structures from the first portion in which the plurality of pores are formed.

2. The method of claim 1, wherein each of the plurality of LED structures further includes a photoactive layer and a p-type III-nitride semiconductor layer stacked on the second portion of the doped n-type III-nitride semiconductor layer.

3. The method of claim 1, wherein the LED wafer on which the plurality of LED structures are formed is formed by operations including:
   operation (a) of preparing the LED wafer in which layers including the doped n-type III-nitride semiconductor layer, a photoactive layer, and a p-type III-nitride semiconductor layer are stacked on a substrate; and
   operation (b) of forming the plurality of LED structures by patterning an upper portion of the LED wafer such that a planar surface perpendicular to a direction, in which the layers in the individual LED structure are stacked, has a desired shape and size, and vertically etching the doped n-type III-nitride semiconductor layer to at least a partial thickness.

4. The method of claim 1, wherein the protective film has a function of preventing damage to the LED structure due to the performing of operation (2).

5. The method of claim 1, wherein
   the protective film formed in operation (1) is a temporary protective film for preventing damage to the LED structure due to the performing of operation (2), and
   the method further comprises forming a surface protective film that surrounds side surfaces of the LED structure after removing the temporary protective film between operation (2) and operation (3).

6. The method of claim 1, wherein an area of a bottom surface of the LED structure, which is connected to the first portion, is 25 µm2 or less.

7. The method of claim 1, wherein a thickness of the protective film is in a range of 5 nm to 100 nm.

8. The method of claim 1, wherein the protective film includes one or more selected from the group consisting of silicon nitride (Si3N4), silicon dioxide (SiO2), aluminum oxide (Al2O3), hafnium oxide (HfO2), zirconium oxide (ZrO2), yttrium oxide (Y2O3), lanthanum oxide (La2O3), scandium oxide (Sc2O3), titanium dioxide (TiO2), aluminum nitride (AlN), and gallium nitride (GaN).

9. The method of claim 1, wherein operation (2) is performed by applying a voltage of 3 V or more for 1 minute to 24 hours.

10. The method of claim 1, wherein the electrolyte includes one or more oxyacids selected from the group consisting of oxalic acid, phosphoric acid, sulfurous acid, sulfuric acid, carbonic acid, acetic acid, chlorous acid, chloric acid, bromic acid, nitrous acid, and nitric acid.

11. The method of claim 1, wherein in operation (2), an average diameter of the plurality of pores is 100 nm or less.

12. The method of claim 1, wherein in operation (3), the plurality of LED structures are separated from the LED wafer by immersing the LED wafer in a bubble-forming solution, and then applying ultrasonic waves to the bubble-forming solution to generate bubbles and collapse the pores through energy generated when the generated bubbles burst in the pores.

13. The method of claim 12, wherein a frequency of the ultrasonic wave applied to the bubble-forming solution is in a range of 10 kHz to 2 MHz to grow and collapse the bubbles so as to become local hot spots that generate a high pressure and temperature when the bubbles are collapsed.

14. The method of claim 1, wherein operation (1) includes:
   forming the protective film on the LED wafer so that the protective film is formed to surround side surfaces of each of the plurality of LED structures; and
   removing the protective film formed on the upper surface of the first portion between the adjacent LED structures so that the upper surface of the first portion between the adjacent LED structures is exposed.

15. The method of claim 1, further comprising:
   between operation (2) and operation (3),
   removing the protective film formed on an upper portion of each of the LED structures; and
   forming a first electrode on the upper portion of the LED structure.

* * * * *